(12) United States Patent
Mitsuda et al.

(10) Patent No.: US 8,508,307 B2
(45) Date of Patent: Aug. 13, 2013

(54) OSCILLATION CIRCUIT

(75) Inventors: Kazuhiro Mitsuda, Kasugai (JP); Koji Okada, Kasugai (JP); Suguru Tachibana, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/158,054

(22) Filed: Jun. 10, 2011

(65) Prior Publication Data

US 2011/0316515 A1 Dec. 29, 2011

(30) Foreign Application Priority Data

Jun. 28, 2010 (JP) ................................. 2010-146408

(51) Int. Cl.
*H03L 1/02* (2006.01)
*H03K 3/26* (2006.01)
*H03K 3/353* (2006.01)

(52) U.S. Cl.
USPC ............. 331/176; 331/74; 331/111; 331/143; 331/186; 327/132; 327/539

(58) Field of Classification Search
USPC ................. 323/313; 327/131, 132, 291, 539; 331/57, 66, 74, 111, 143, 176, 185, 186
See application file for complete search history.

(56) References Cited

U.S. PATENT DOCUMENTS

| | | | | |
|---|---|---|---|---|
| 6,020,792 A | * | 2/2000 | Nolan et al. | 331/111 |
| 6,356,161 B1 | * | 3/2002 | Nolan et al. | 331/176 |
| 7,068,116 B2 | * | 6/2006 | Kato et al. | 331/111 |
| 7,199,646 B1 | * | 4/2007 | Zupcau et al. | 327/539 |
| 7,884,679 B2 | * | 2/2011 | Mahooti | 331/143 |
| 8,067,992 B2 | * | 11/2011 | Chen et al. | 331/111 |
| 2007/0152740 A1 | | 7/2007 | Georgescu et al. | |
| 2007/0252573 A1 | | 11/2007 | Tachibana et al. | |
| 2008/0106954 A1 | * | 5/2008 | Sinha et al. | 365/194 |
| 2008/0238517 A1 | * | 10/2008 | Nunokawa et al. | 327/291 |
| 2011/0156825 A1 | * | 6/2011 | Aruga et al. | 331/108 A |

FOREIGN PATENT DOCUMENTS

| | | |
|---|---|---|
| JP | 62-243414 A | 10/1987 |
| JP | 7-22253 B2 | 3/1995 |
| JP | 2007-299294 A | 11/2007 |
| JP | 2008-252414 A | 10/2008 |
| JP | 2009-522661 A | 6/2009 |
| WO | WO 2007/081634 A2 | 7/2007 |

* cited by examiner

*Primary Examiner* — Levi Gannon
(74) *Attorney, Agent, or Firm* — Arent Fox LLP

(57) ABSTRACT

An oscillation circuit including a reference voltage generation circuit that adds a proportional-to-absolute-temperature (PTAT) output, which increases in proportion to an absolute temperature, to a complementary-to-absolute-temperature (CTAT) output, which decreases in proportion to an absolute temperature, to generate and output a reference voltage. The oscillation circuit generates an oscillation signal having a desired and fixed frequency.

7 Claims, 14 Drawing Sheets

Current Values of IP31, IN31

±2%

Temperature

Oscillation Frequency

±2%

Temperature

OSCILLATION CIRCUIT

CROSS-REFERENCE TO RELATED APPLICATION

This application is based upon and claims the benefit of priority from prior Japanese Patent Application No. 2010-146408, filed on Jun. 28, 2010, the entire contents of which are incorporated herein by reference.

FIELD

The present disclosure relates to an oscillation circuit.

BACKGROUND

In recent years, generation of a high-precision (for example, within ±1.5%) clock signal has been requested for a communication protocol for a vehicle. When a crystal oscillator or a ceramic oscillator is used to generate a high-precision clock signal in a vehicle, vibration may damage the oscillator. For example, solder, which holds the oscillator in a fixed state, may separate from the oscillator and cracking may occur in the oscillator. Further, costs should be reduced. Accordingly, there is a demand for oscillation circuits that are incorporated in a silicon device. In order to realize a high-precision oscillation circuit on a silicon device, various proposals have been made.

FIG. 1 illustrates a conventional CR oscillation circuit. The CR oscillation circuit of FIG. 1 includes inverters INV101, INV102, and INV103, a capacitor C101, and a resistor R101. FIG. 2 illustrates waveforms at nodes in an operating state of the CR oscillation circuit in FIG. 1. As illustrated in FIG. 2, waveforms at nodes ND101, ND102, and ND103 are rectangular waves. Capacitive coupling with the node ND102 changes voltage at a node ND104 in the same direction as that at node ND102 when voltage at the node ND102 changes. Then, the voltage at node ND104 is charged and discharged by a voltage at node ND103 via the resistor R101 and gradually changes. The broken line in FIG. 2 indicates a threshold value Vth of the inverter INV101.

An oscillation frequency of the CR oscillation circuit in FIG. 1 generally has fluctuations of −50% to +100% due to the power supply voltage, temperature, resistance of the resistor R101, capacitance of the capacitor C101, and fluctuation in these factors.

FIG. 3 illustrates another conventional CR oscillation circuit. The CR oscillation circuit in FIG. 3 includes inverters INV31, INV32, and INV33, capacitors C31 and C32, current sources IP31 and IN31, PMOS transistors MP31, MP32, and MP33, NMOS transistors MN31 and MN32, an operational amplifier AMP31, a resistor R31, a reference voltage generation circuit 31, a setting register 32, a bias generation circuit 33, and a constant voltage circuit 34.

In the CR oscillation circuit in FIG. 3, an oscillation frequency of a signal output from an output terminal OUT is determined based on an output voltage VREG of the constant voltage circuit 34 and current values of the current sources IP31 and IN31. When the constant voltage circuit 34 supplies the output voltage VREG at a constant level, a signal width of a node ND31 becomes constant without depending on a power supply voltage. Current values of the current sources IP31 and IN31 that charge and discharge the capacitors C31 and C32 are determined based on a reference voltage output by the reference voltage generation circuit 31. Due to process fluctuations, the reference voltage and the current values of the current sources IP31 and IN31, as illustrated in FIG. 4, have linear temperature dependencies that change upward and downward in accordance with the temperature. The setting register 32 trims the temperature dependency of the reference voltage output by the reference voltage generation circuit 31 to make the current values of the current sources IP31 and IN31 constant independently of the temperature.

The following documents are related to the background art described above.
Japanese Laid-Open Patent Publication No. 2008-252414
Japanese Laid-Open Patent Publication No. 2007-299294
Japanese National Phase Laid-Open Patent Publication No. 2009-522661
Japanese Patent No. 7-22253

SUMMARY

However, in the CR oscillation circuit of FIG. 3, the current values of the current sources IP31 and IN31 are not completely constant even though the linear temperature dependencies such as upward sloping and downward sloping are canceled and have quadratic temperature dependencies. In this manner, the precision of the oscillation frequency is up to about ±2% as illustrated in FIG. 5.

One aspect of the embodiments is an oscillation circuit including a reference voltage generation circuit that adds a proportional-to-absolute-temperature (PTAT) output, which increases in proportion to an absolute temperature, to a complementary-to-absolute-temperature (CTAT) output, which decreases in proportion to an absolute temperature, to generate and output a reference voltage. A first switching unit is coupled to the reference voltage generation circuit. The first switching unit switches an adding ratio of the PTAT output and the CTAT output to minimize a variation in an output from the reference voltage generation circuit that depends on temperature. A current source generates constant current based on the output from the reference voltage generation circuit. A regulator circuit generates constant voltage based on the output from the reference voltage generation circuit. A first capacitor and a second capacitor, each includes one terminal coupled to the current source and is charged and discharged by the constant current of the current source. An inverter is coupled to another terminal of the second capacitor. The inverter drives the second capacitor using the constant voltage supplied from the regulator circuit as a power supply. A second switching unit switches a value of the constant current of the current source to adjust an oscillation frequency. A third switching unit is coupled to the first capacitor. The third switch unit switches capacitance of the first capacitor to adjust oscillation amplitudes at the one terminal of each of the first and second capacitors. The first switching unit, the second switching unit, and the third switching unit perform trimming to generate an oscillation signal having a desired and fixed frequency.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

DESCRIPTION OF EMBODIMENTS

Figure 1:
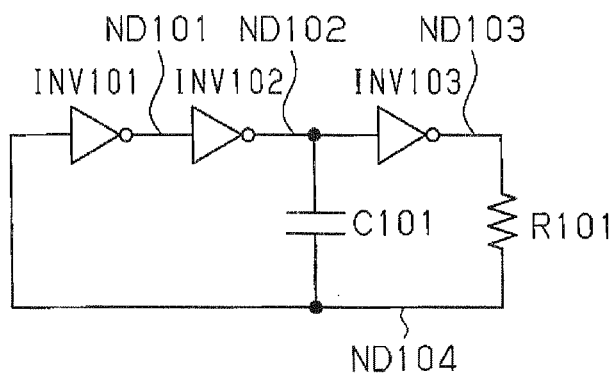
FIG. 1 is a circuit diagram of a CR oscillation circuit according to a prior art reference.
Figure 2:
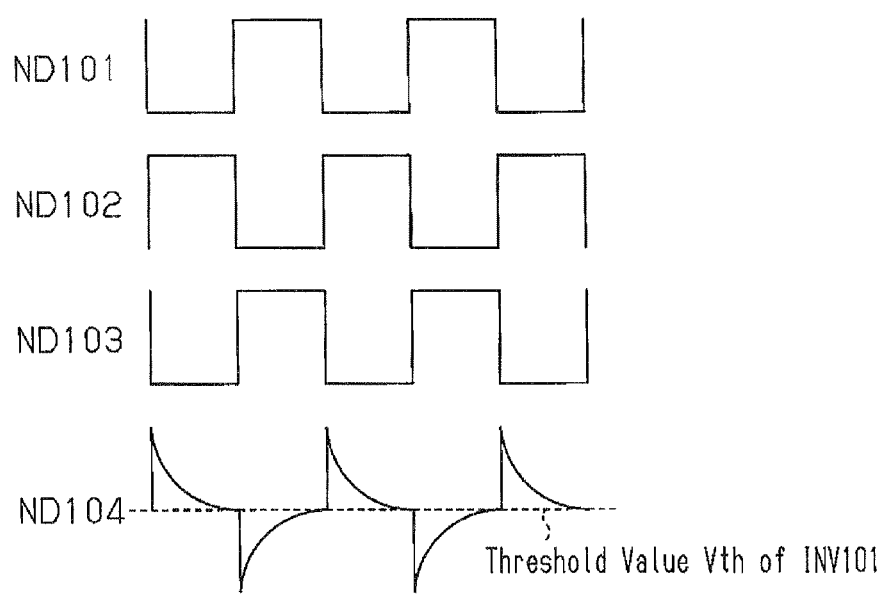
FIG. 2 is a waveform chart illustrating waveforms at nodes of the CR oscillation circuit in FIG. 1.
Figure 3:
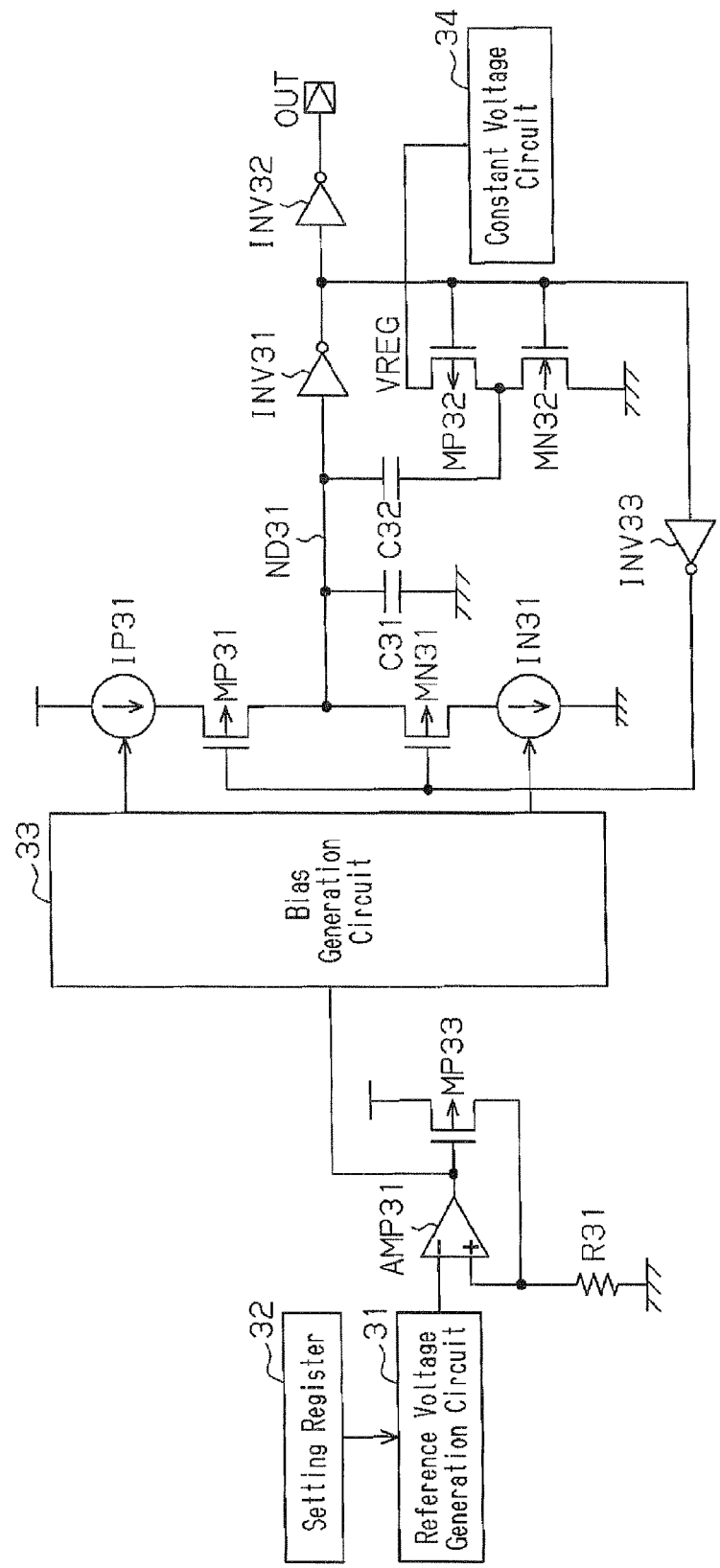
FIG. 3 is a circuit diagram of a CR oscillation circuit according to another prior art reference.
Figure 4:
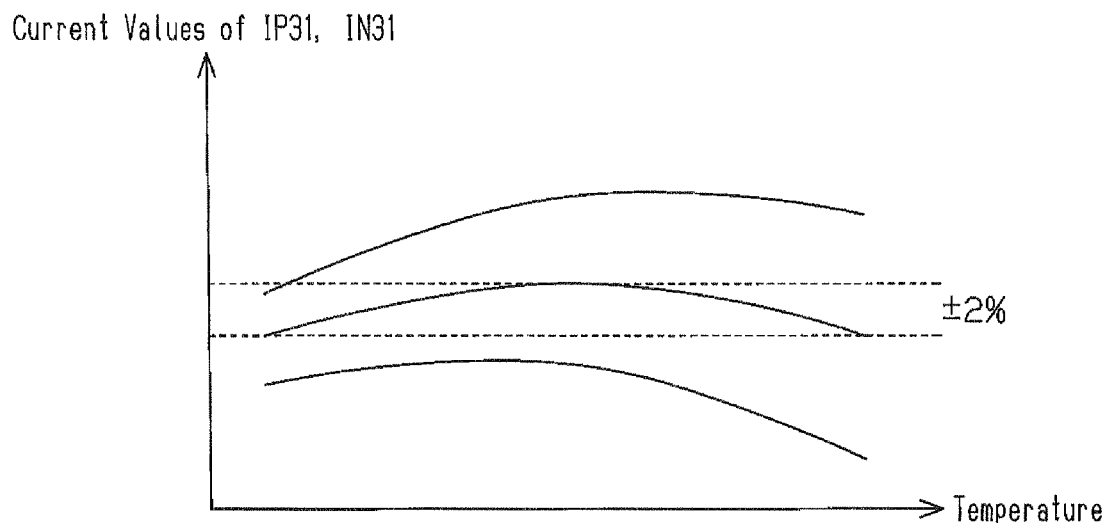
FIG. 4 is a graph illustrating a temperature dependency of a current value of a current source in the CR oscillation circuit in FIG. 3.
Figure 5:
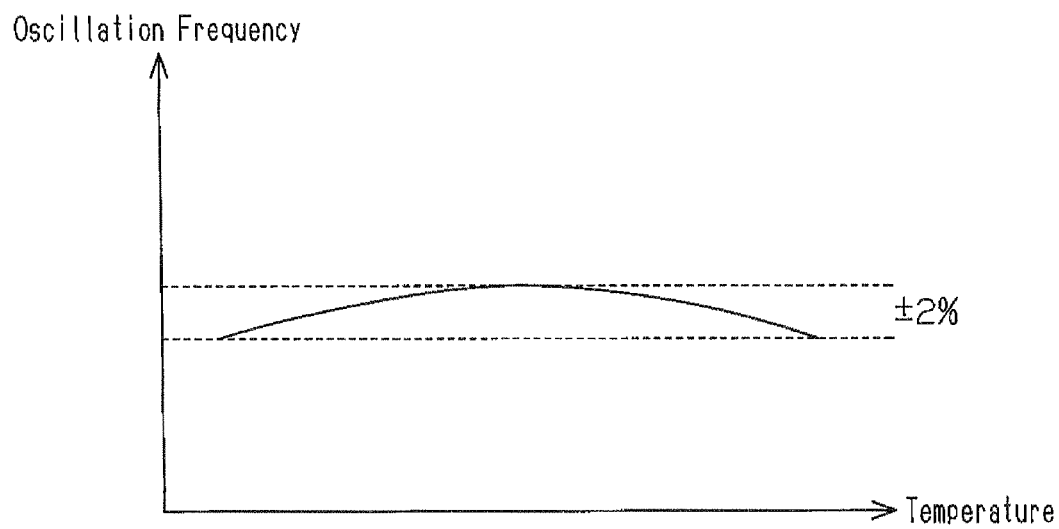
FIG. 5 is a graph illustrating a temperature dependency of an oscillation frequency of the CR oscillation circuit in FIG. 3.
Figure 6:
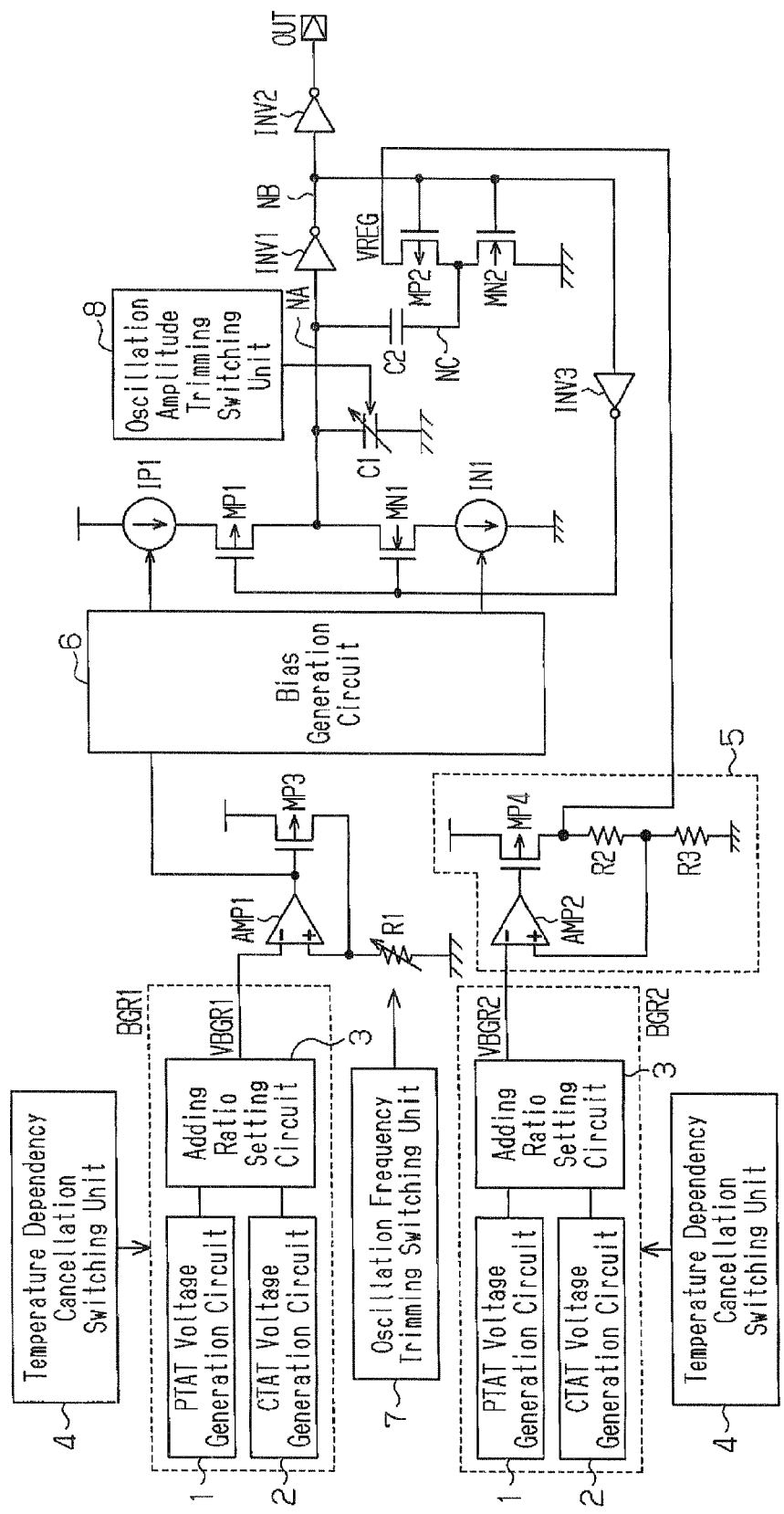
FIG. 6 is a block diagram of an oscillation circuit according to a first embodiment.

An oscillation circuit according to a first embodiment will be described below with reference to FIG. 6. An operational amplifier AMP1 and a PMOS transistor MP3 configure a feedback amplification circuit that performs feedback control such that a voltage applied to a resistor R1 is matched with an output from a band gap reference circuit BGR1, namely, a reference voltage VBGR1. The PMOS transistor MP3 is biased to cause a current to flow in the PMOS transistor MP3 when the same voltage as the reference voltage VBGR1 is applied to the resistor R1. The bias voltage is also applied to a bias generation circuit 6. The bias generation circuit 6 generates control signals for current sources IP1 and IN1 based on the given bias voltage. As will be described later, the resistor R1 has a resistance that can be switched, or adjusted.

An operational amplifier AMP2, a PMOS transistor MP4, and resistors R2 and R3 configure a regulator circuit 5 that generates an output voltage VREG. A reference voltage VBGR2 is supplied from a band gap reference circuit BGR2 to the operational amplifier AMP2. The output voltage VREG from the regulator circuit 5 is generated in accordance with resistance-divided voltages of the resistors R2 and R3 based on the reference voltage VBGR2.

Each of the band gap reference circuits BGR1 and BGR2 includes a PTAT voltage generation circuit 1, a CTAT voltage generation circuit 2, and an adding ratio setting circuit 3. In order to trim the temperature dependencies of the reference voltages VBGR1 and VBGR2, a temperature dependency cancellation switching unit 4 is arranged for each of the band gap reference circuits BGR1 and BGR2.

Figure 7:
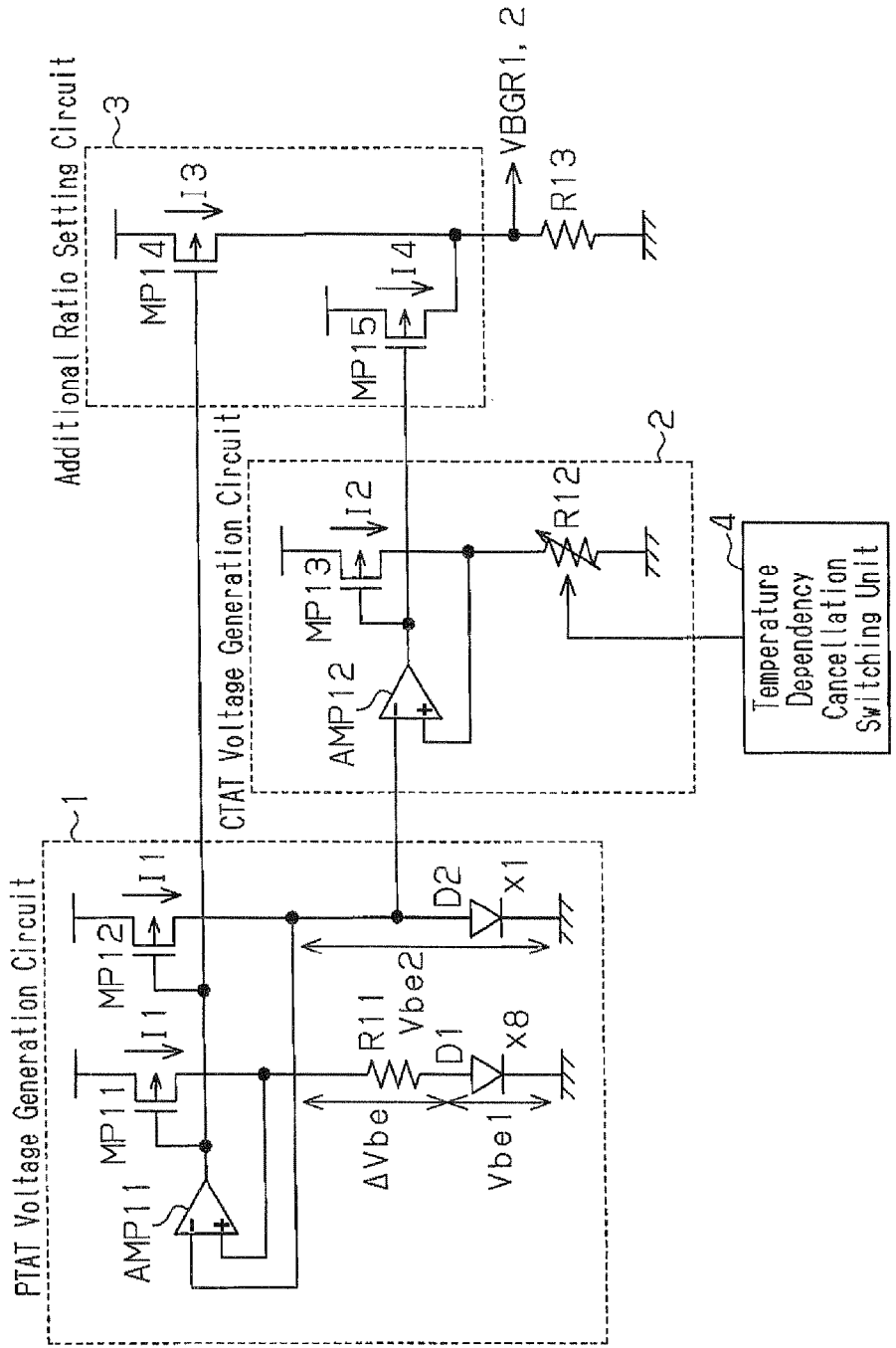
FIG. 7 is a circuit diagram of a band gap reference circuit.

Configurations and operations of the band gap reference circuits BGR1 and BGR2 will be described below with reference to FIGS. 7 and 8. Since the configuration and the operation of the band gap reference circuit BGR2 are the same as those of the band gap reference circuit BGR1, only the band gap reference circuit BGR1 will be described below. As illustrated in FIG. 7, in the PTAT voltage generation circuit 1 of the band gap reference circuit BGR1, a PMOS transistor MP11, a resistor R11, and a diode D1 are coupled in series between a power supply and ground. A PMOS transistor MP12 and a diode D2 are coupled in series between the power supply and the ground. The gates of the PMOS transistors MP11 and MP12 are commonly coupled to an output of an operational amplifier AMP11. Size ratios (channel width w/channel length L) of the PMOS transistors MP11 and MP12 are set to be equal to each other to cause equal currents I1 to flow in the PMOS transistors MP11 and MP12. The operational amplifier AMP11 includes a non-inverted input terminal coupled to one end of the resistor R11 and an inverted input terminal coupled to an anode of the diode D2. Numbers (x8 and x1) added to the diodes D1 and D2 denote a relative area ratio of the diodes D1 and D2.

Figure 8A:
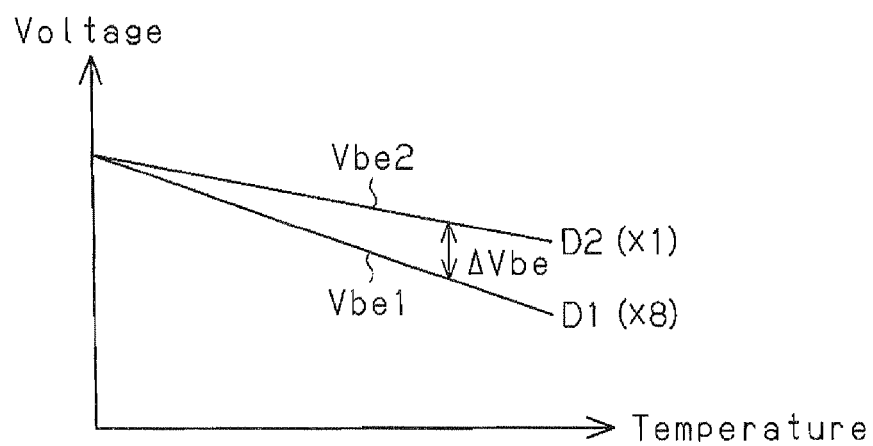
FIGS. 8(A) to 8(C) are graphs illustrating temperature dependencies of various characteristics of the band gap reference circuit in FIG. 7.
Figure 8B:
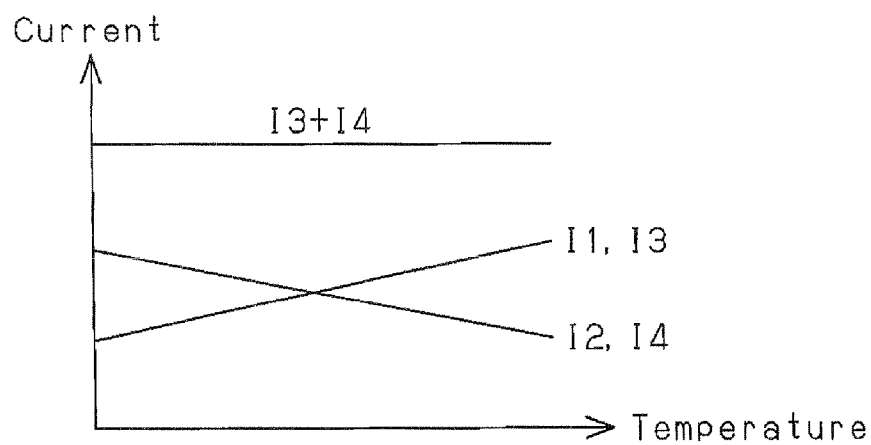
Figure 8C:
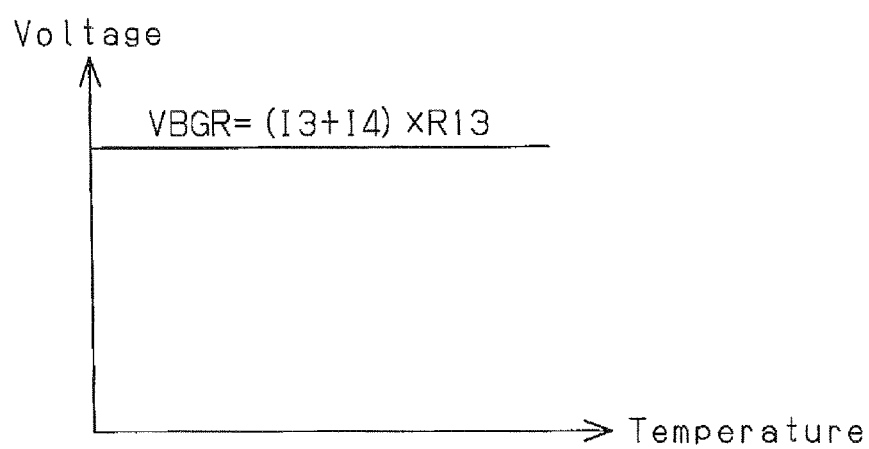

As illustrated in FIG. 8(A), it is known that forward voltages Vbe1 and Vbe2 of the p-n junction diodes D1 and D2 decrease in proportion to absolute temperature. The operational amplifier AMP11 has an output terminal coupled to the inverted and non-inverted input terminals to configure a negative feedback circuit that matches a voltage at one end of the resistor R11 with a voltage of the anode of the diode D2. An output from the operational amplifier AMP11 is fixed to a voltage at which the voltage at one end of the resistor R11 is matched with the forward voltage Vbe2 of the diode D2. In the example illustrated in FIG. 8(A), an area ratio of the diodes D1 and D2 is 8:1, and the diodes D1 and D2 operate with different current densities, respectively. In this manner, a difference ΔVbe (=Vbe2−Vbe1) between the forward voltages of the diodes D1 and D2 is applied across the two ends of the resistor R11. As illustrated in FIG. 8(A), the difference ΔVbe between the forward voltages of the diodes D1 and D2 increases in proportion to an absolute temperature. Therefore, the current I1 is a proportional-to-absolute-temperature (PTAT) current that increases in proportion to an absolute temperature.

In the CTAT voltage generation circuit 2, a PMOS transistor MP13 and a resistor R12 are coupled in series between the power supply and ground. The gate of the PMOS transistor MP13 is coupled to an output of an operational amplifier AMP12. The PMOS transistor MP13 causes a current I2 to flow in an ON state. The operational amplifier AMP12 includes a non-inverted input terminal coupled to one end of the resistor R12 and an inverted input terminal coupled to an anode of the diode D2 of the PTAT voltage generation circuit 1. As will be described later, the resistor R12 has a resistance that can be switched, or adjusted.

The operational amplifier AMP12 has an output terminal coupled to the non-inverted input terminal to configure a negative feedback circuit that matches a voltage at one end of the resistor R12 with a voltage at the anode of the diode D2 of the PTAT voltage generation circuit 1. An output from the operational amplifier AMP12 is fixed to a voltage at which the voltage at one end of the resistor R12 is matched with the forward voltage Vbe2 of the diode D2. In this manner, a voltage equal to the forward voltage Vbe2 of the diode D2 is applied across the two ends of the resistor R12. As described above, the forward voltage Vbe2 of the diode D2 decreases in proportion to an absolute temperature. Therefore, the current I2 is a complementary-to-absolute-temperature (CTAT) current that decreases in proportion to an absolute temperature.

The adding ratio setting circuit 3 includes PMOS transistors MP14 and MP15. Since a gate voltage of the PMOS transistor MP14 is controlled by an output from the operational amplifier AMP11, current I3 flowing in the PMOS transistor MP14 is a PTAT current. An absolute value of the current I3 is determined by a difference between a size ratio (channel width/channel length) of the PMOS transistor MP14 and a size ratio of the PMOS transistors MP11 and MP12. Since a gate voltage of the PMOS transistor MP15 is controlled by an output from the operational amplifier AMP12, a current I4 flowing in the PMOS transistor MP15 is a CTAT current. An absolute value of the current I4 is determined by a difference between a size ratio (channel width/channel length) of the PMOS transistor MP15 and a size ratio of the PMOS transistor MP13.

A current obtained by adding the current I3 and the current I4 flows in a resistor R13. When the ratio of a PTAT current having a positive dependency on an absolute temperature to a CTAT current having a negative dependency on an absolute temperature is appropriately adjusted, total current (I3+I4) flowing in the resistor R13 does not depend on the temperature (see FIG. 8(B)). In the example illustrated in FIG. 8(B), the temperature dependency cancellation switching unit 4 switches the resistance of the resistor R12 to adjust values of the CTAT currents (I2 and I4). In this manner, the total current that does not depend on a temperature flow in the resistor R13. A voltage converted in the resistor R13 is output as the reference voltage VBGR1. In this manner, the band gap reference circuits BGR1 and BGR2 generate and output the reference voltages VBGR1 and VBGR2 that do not depend on the temperatures, respectively (see FIG. 8(C)).

Figure 9:
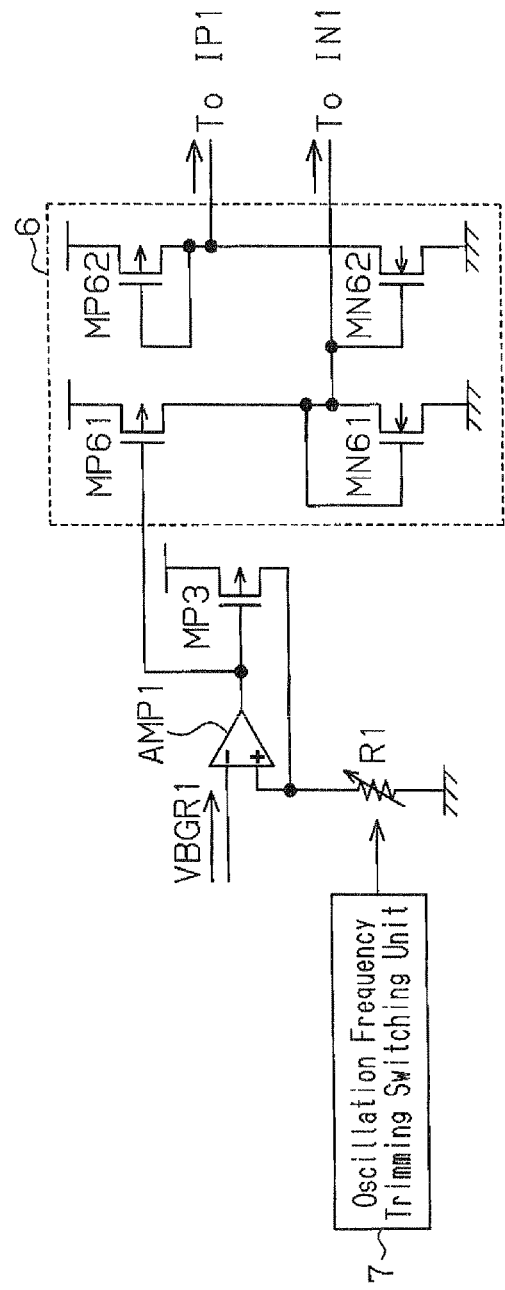
FIG. 9 is a circuit diagram of a bias generation circuit.

The configuration and operation of the bias generation circuit 6 will be described below with reference to FIG. 9. As illustrated in FIG. 9, the bias generation circuit 6 is a current mirror circuit including PMOS transistors MP61 and MP62 and NMOS transistors MN61 and MN62. Based on an output from the feedback-controlled operational amplifier AMP1, a reference current determined by the reference voltage VBGR1 and the resistance of the resistor R1 flows in the PMOS transistor MP3. This reference current is adjusted by the bias generation circuit 6, namely, the current mirror circuit, depending on a mirror ratio to generate control signals for the current sources IP1 and IN1. In the example illustrated in FIG. 9, an oscillation frequency trimming switching unit 7, which is coupled to the resistor R1, switches the resistance of the resistor R1 and adjusts the value of the reference current. In this manner, values of constant currents of the current sources IP1 and IN1 are switched.

Returning to FIG. 6, operation and configuration of the oscillation circuit will be described below. The oscillation circuit in FIG. 6 includes an oscillation control unit including the various circuits described above and an oscillation circuit unit (oscillation signal generating unit) controlled by the oscillation control unit. The oscillation circuit unit includes inverters INV1, INV2, and INV3, capacitors C1 and C2, the current sources IP1 and IN1, PMOS transistors MP1 and MP2, NMOS transistors MN1 and MN2, and an oscillation amplitude trimming switching unit 8. An input terminal of the inverter INV1 is coupled to one terminal (nodes NA) of each of the capacitors C1 and C2. The input terminal of the inverter INV2 is coupled to an output terminal (node NB) of the inverter INV1. The inverter INV2 inverts a rectangular waveform oscillation signal output from the inverter INV1 to output the inverted rectangular waveform oscillation signal from an output terminal OUT. An input terminal of the inverter INV3 is coupled to an output terminal of the inverter INV1. The inverter INV3 inverts an output from the inverter INV1 to supply the inverted output to the gates of the PMOS transistor MP1 and the NMOS transistor MN1. According to the output from the inverter INV3, the PMOS transistor MP1 and the NMOS transistor MN1 are alternately turned on to couple said one terminal of each of the capacitors C1 and C2 to the current source IP1 or IN1 and to charge and discharge the capacitors C1 and C2. The PMOS transistor MP2 and the NMOS transistor MN2 have gates commonly coupled to the output of the inverter INV1. A node between the PMOS transistor MP2 and the NMOS transistor MN2 is coupled to the other terminal (node NC) of the capacitor C2. The PMOS transistor MP2 and the NMOS transistor MN2 configure an inverter that drives the other terminal (node NC) of the capacitor C2 by using the output voltage VREG of the regulator circuit 5 as a power supply. As will be described later, the capacitor C1 has a capacitance that can be switched, or adjusted.

Figure 10:
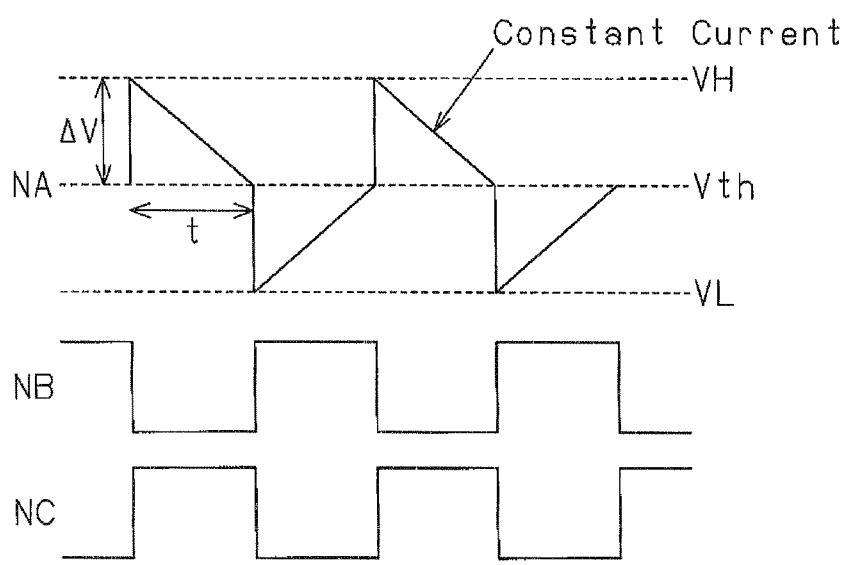
FIG. 10 is a waveform chart illustrating waveforms at nodes in the oscillation circuit unit according to the first embodiment.

FIG. 10 illustrates waveforms at the nodes NA, NB, and NC of the oscillation circuit unit. As illustrated in FIG. 10, the waveforms at the nodes NB and NC are rectangular waveforms. The voltage at the node NA rises at a rising time of the node NC due to capacitive coupling with the node NC and, thereafter, is discharged by a constant current of the current source IN1 and decreases. When the voltage at the node NA is lower than the threshold value Vth of the inverter INV1, the voltages at the nodes NB and NC are inverted. For this reason, at this time, the voltage at the node NA falls at a falling time of the node NC and, thereafter, is charged by a constant current of the current source IP1 and increases. When the voltage at the node NA is higher than the threshold value Vth of the inverter INV1, the voltages at nodes NB and NC are inverted again. Thereafter, the same operation is repeated.

Subsequently, an oscillation frequency Fosc of an oscillation signal is calculated.

An oscillation amplitude ΔV at the node NA is determined by the output voltage VREG of the regulator circuit 5 and a capacitance-divided voltage.

$$\Delta V = VH - Vth = Vth - VL = (C2/(C1+C2)) \times VREG \quad (1)$$

Here, C1 and C2 are capacitances of the capacitors C1 and C2.

When values of constant currents of the current sources IP1 and IN1 and a half cycle are given by I and t, respectively, a relationship expressed by the following equation is given:

$$I \times t = \Delta V \times (C1+C2) \quad (2)$$

According to equations (1) and (2), $$t = (\Delta V \times (C1+C2))/I = ((C2/(C1+C2)) \times VREG \times (C1+C2))/I = C2 \times VREG/I \quad (3)$$

Therefore, according to equation (3), the oscillation frequency Fosc is expressed by the following equation:

$$Fosc = 1/(2 \times t) = 1/(2 \times C2 \times VREG) \quad (4)$$

When the reference voltage VBGR1 output from the band gap reference circuit BGR1 decreases, current values of the current sources IP1 and IN1 decreases. At this time, as is apparent from equation (4), the oscillation frequency Fosc decreases. When the reference voltage VBGR2 output from the band gap reference circuit BGR2 decreases, the output voltage VREG of the regulator circuit 5 is lowered to decrease the oscillation amplitude ΔV. In this case, as is apparent from equation (4) in FIG. 10, the oscillation frequency Fosc increases. Therefore, a change of the oscillation frequency Fosc by the temperature dependencies of the current values of the current sources IP1 and IN1 and a change of the oscillation frequency Fosc by a temperature dependency of the output voltage VREG of the regulator circuit 5 are canceled out. In the first embodiment, the oscillation amplitude trimming switching unit 8 switches the capacitance of the capacitor C1 to adjust the oscillation amplitude ΔV. In this manner, a fixed frequency can be generated.

A trimming procedure in the first embodiment will be described below with reference to FIGS. 11(A) to 11(E).

Figure 11:
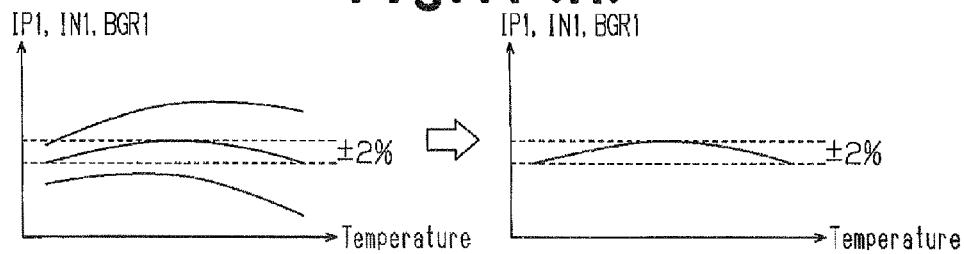
FIGS. 11(A) to 11(E) are diagrams for explaining trimmings in the first embodiment.
Figure 11:
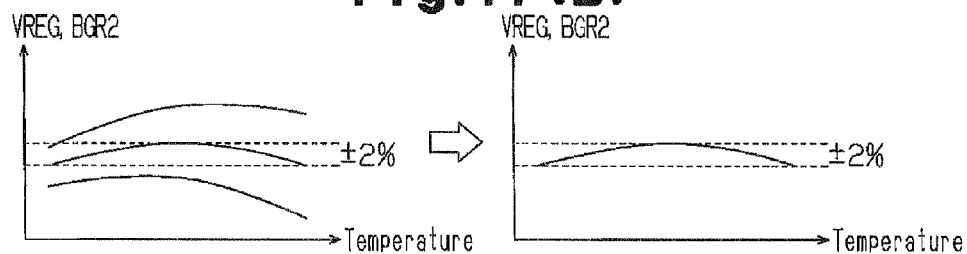
Figure 11:
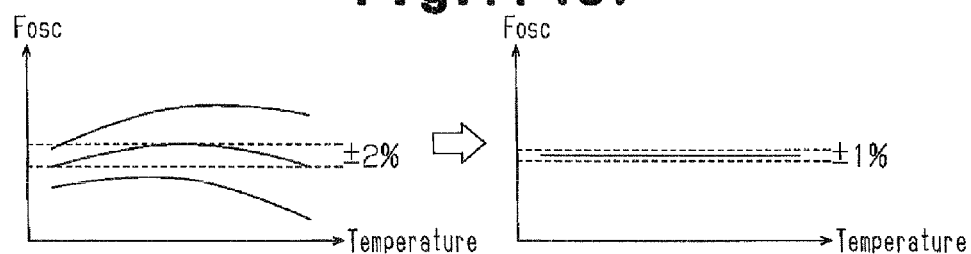
Figure 11:
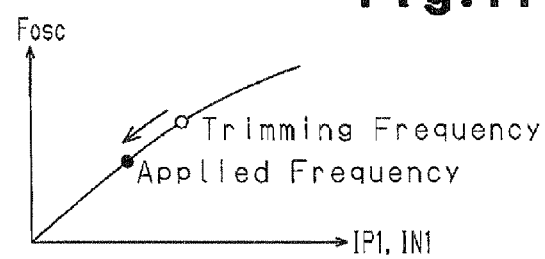
Figure 11:
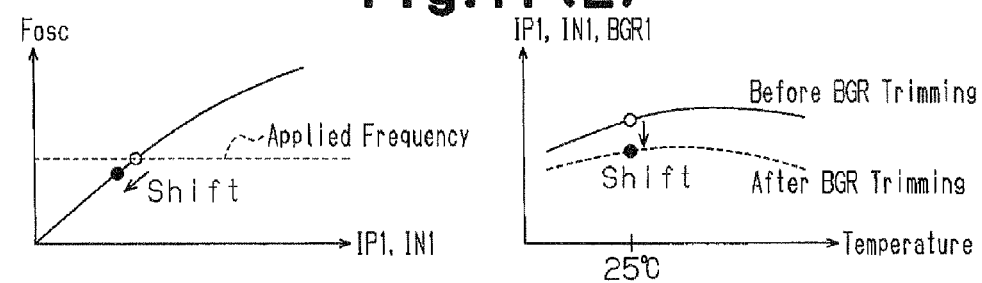

(1) Canceling of Linear Temperature Dependencies of the Band Gap Reference Circuits BGR1 and BGR2 by the Temperature Dependency Cancellation Switching Unit 4 (see FIG. 11A and 11B)

The temperature dependency of the band gap reference circuit BGR1 corresponds to the temperature dependencies of the current values of the current sources IP1 and IN1 (FIG. 11A). The temperature dependency of the band gap reference circuit BGR2 corresponds to a temperature dependency of the output voltage VREG of the regulator circuit 5 (FIG. 11(B)). The linear temperature dependencies such as an upward-sloping dependency or a downward-sloping dependency held by the band gap reference circuits BGR1 and BGR2 are canceled by the temperature dependency cancellation switching unit 4.

(2) Adjustment of the Oscillation Amplitude ΔV by the Oscillation Amplitude Trimming Switching Unit 8 (see FIG. 11(C))

The degree of lowering of the oscillation amplitude ΔV with respect to the lowering of the output voltage VREG of the regulator circuit 5 is adjusted by the oscillation amplitude trimming switching unit 8 to cancel a quadratic temperature dependency of the oscillation frequency Fosc.

The current sources IP1 and IN1 generate currents that charge and discharge the capacitors C1 and C2 based on the reference voltage VBGR1 output by the band gap reference circuit BGR1. Therefore, the charging and discharging currents have the temperature dependencies as illustrated in FIG. 11A. When the charging and discharging currents decrease, the oscillation frequency Fosc decreases.

The oscillation amplitude ΔV is determined based on the output voltage VREG of the regulator circuit 5. In the regulator circuit 5 (see FIG. 6), the influences of the temperature dependencies of the resistors R2 and R3 are canceled by resistance-divided voltages. For this reason, the output voltage VREG of the regulator circuit 5 has the same temperature dependency, as illustrated in FIG. 11(B), as that of the reference voltage VBGR2 output by the band gap reference circuit BGR2. When the output voltage VREG decreases, the oscillation frequency Fosc increases.

Since the band gap reference circuits BGR1 and BGR2 have the same configurations, the temperature dependencies of the reference voltages VBGR1 and VBGR2 are equal to each other. When a temperature dependency of a charging and discharging current corresponding to the reference voltage VBGR1 and a temperature dependency of the output voltage VREG of the regulator circuit 5 are inversely summed up, even though an output precision of each of the band gap reference circuit is about ±2% as in a prior art reference, precision of the oscillation frequency Fosc can be maintained at ±1% or less (FIG. 11(C)). When the oscillation amplitude trimming switching unit 8 adjusts a capacitance of the capacitor C1, the oscillation amplitude ΔV can be adjusted. For this reason, a quadratic temperature dependency that slightly remains after a linear temperature dependency, such as an upward-sloping or downward-sloping dependency, is smoothed and can be canceled. In this manner, a high-precision (for example, within ±1%) oscillation circuit can be obtained.

(3) Adjustment of the Oscillation Frequency Fosc by the Oscillation Frequency Trimming Switching Unit 7 (see FIG. 11(D))

The oscillation frequency Fosc is adjusted by the oscillation frequency trimming switching unit 7 from frequencies at which the trimmings of the (1) and (2) are performed to a desired applied frequency (FIG. 11(D)). When the oscillation frequency trimming switching unit 7 adjusts the resistance of the resistor R1, the value of the reference current of the bias generation circuit 6 can be adjusted. In this manner, the current values of the current sources IP1 and IN1 that charge and discharge the capacitors C1 and C2 are adjusted to make it possible to adjust the oscillation frequency Fosc to a desired value (applied frequency).

Until the oscillation frequency Fosc is converged, the trimming procedures (1) to (3) are repeated in the order given by (1)→(2)→(3)→(1)→(2)→(3)→ . . . , and a desired and constant oscillation frequency Fosc is generated. The oscillator can be used at a frequency that is closer to a desired value when the trimming is repeated. However, the trimming need not be always repeated. In step (3), although the resistance of the resistor R1 is trimmed, since the resistor has a quadratic temperature characteristic, before and after trimming of the resistance of the resistor R1, the change ratio of the current values of the current sources IP1 and IN1 is not completely proportional to the change ratio of the oscillation frequency Fosc (see FIG. 11(D)). Therefore, in order to match the oscillation frequency Fosc with the desired value, trimming is desired to be gradually performed.

The trimmings in steps (1) and (2) are performed prior to the trimming in step (3) for the following reasons. For example, when the linear temperature dependency of the band gap reference circuit BGR1 are left uncancelled, the oscillation frequency Fosc is adjusted to the applied frequency by the trimming in step (3). Thereafter, when the linear temperature dependency of the band gap reference circuit BGR1 is canceled, the oscillation frequency Fosc shifts from the applied frequency (see FIG. 11(E)). Therefore, it is considered that, when the oscillation frequency Fosc is adjusted by the trimming in (3) after the temperature dependency is canceled by the trimmings in steps (1) and (2), the oscillation frequency Fosc is converged early.

Figure 12:
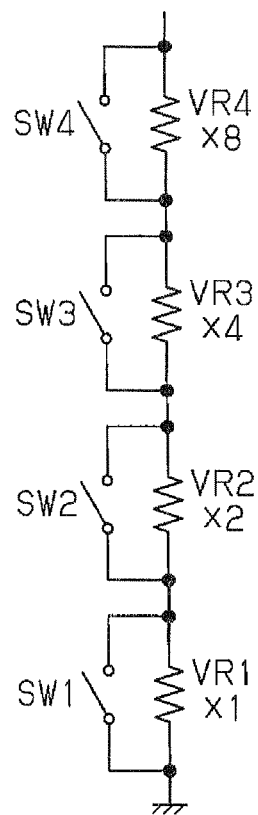
FIG. 12 is a circuit diagram of an example of a resistor switching unit.

With reference to FIG. 12, switching of the resistance of the resistor R1 by the temperature dependency cancellation switching unit 4 and switching of the resistance of the resistor R1 by the oscillation frequency trimming switching unit 7 will now be described.

FIG. 12 illustrates an example of a resistor switching unit, which switches resistances and can be included in the temperature dependency cancellation switching unit 4 and the oscillation frequency trimming switching unit 7. Resistors VR1, VR2, VR3, and VR4 are examples of the resistor R1 in FIG. 6 and the variable resistor R12 in FIG. 7. The resistors VR1, VR2, VR3, and VR4 are coupled in series with each other. Switches SW1, SW2, SW3, and SW4 included in the resistor switching unit are coupled in parallel to the resistors VR1, VR2, VR3, and VR4, respectively. Numbers (x1, x2, x4, and x8) added to the resistors VR1, VR2, VR3, and VR4 denote examples of ratios of relative resistances of the resistors VR1, VR2, VR3, and VR4. With the above configuration, the ON/OFF states of the switches SW1, SW2, SW3, and SW4 are switched to obtain desired resistances. The resistor switching unit controls the switches based on, for example, a value set in a register to make it possible to realize switching of the resistances.

Figure 13:
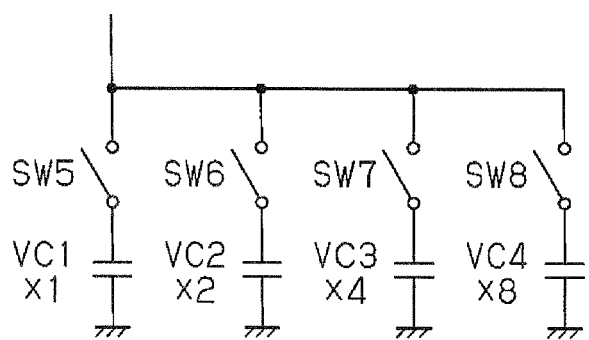
FIG. 13 is a circuit diagram of an example of a capacitor switching unit.

Switching of a capacitance of the capacitor C1 by the oscillation amplitude trimming switching unit 8 will be described below with reference to FIG. 13. FIG. 13 illustrates an example of a capacitor switching unit that is included in the oscillation amplitude trimming switching unit 8 and that switches capacitances. Capacitors VC1, VC2, VC3, and VC4 are examples of the capacitor C1 in FIG. 6. The capacitors VC1, VC2, VC3, and VC4 are coupled in parallel with each other. Switches SW5, SW6, SW7, and SW8 in the capacitor switching unit are coupled in series with the capacitors VC1, VC2, VC3, and VC4, respectively. Numbers (x1, x2, x4, and x8) added to the capacitors VC1, VC2, VC3, and VC4 denote examples of ratios of relative capacitances of the capacitors VC1, VC2, VC3, and VC4. With the above configuration, the ON/OFF states of the switches SW5, SW6, SW7, and SW8 are switched to obtain desired capacitances. The capacitor switching unit controls the switches based on, for example, a value set in a register to make it possible to realize switching of the capacitances.

Figure 14:
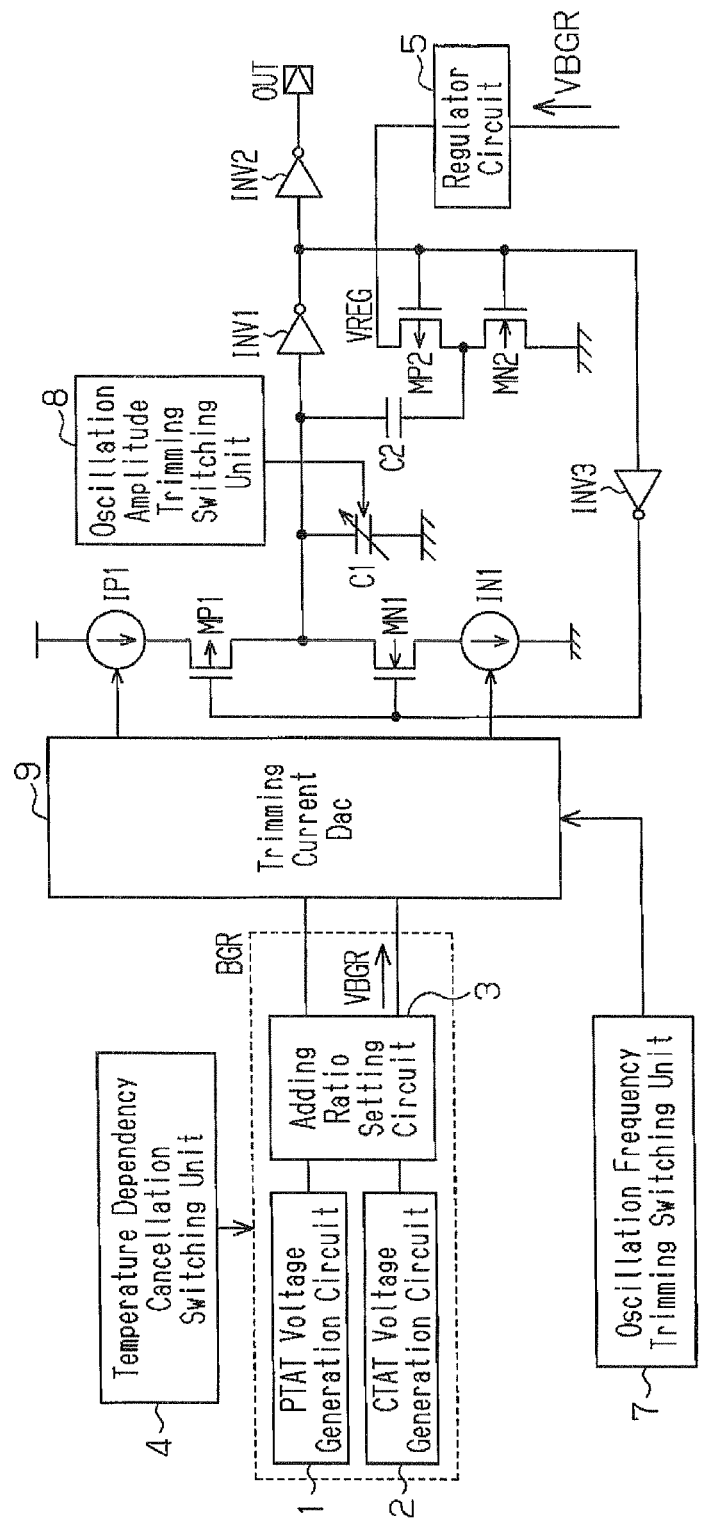
FIG. 14 is a block diagram of an oscillation circuit according to a second embodiment.

A second embodiment of an oscillation circuit will now be described with reference to FIG. 14 focusing on differences from the first embodiment. Like or same reference numerals are given to those components that are the same as the corresponding components of the first embodiment. Such components will not be described.

In the second embodiment, the band gap reference circuits BGR1 and BGR2 according to the first embodiment are commonly coupled, and the current values of the current sources IP1 and IN1 and the output voltage VREG of the regulator circuit 5 are controlled by a single band gap reference circuit BGR. Instead of the bias generation circuit 6 according to the first embodiment, a trimming current DAC 9 is used in the second embodiment.

The configuration and operation of the trimming current DAC 9 will be described below with reference to FIG. 15. Like or same reference numerals are given to those components that are the same as the corresponding components in the drawings described above. Such components will not be described.

Figure 15:
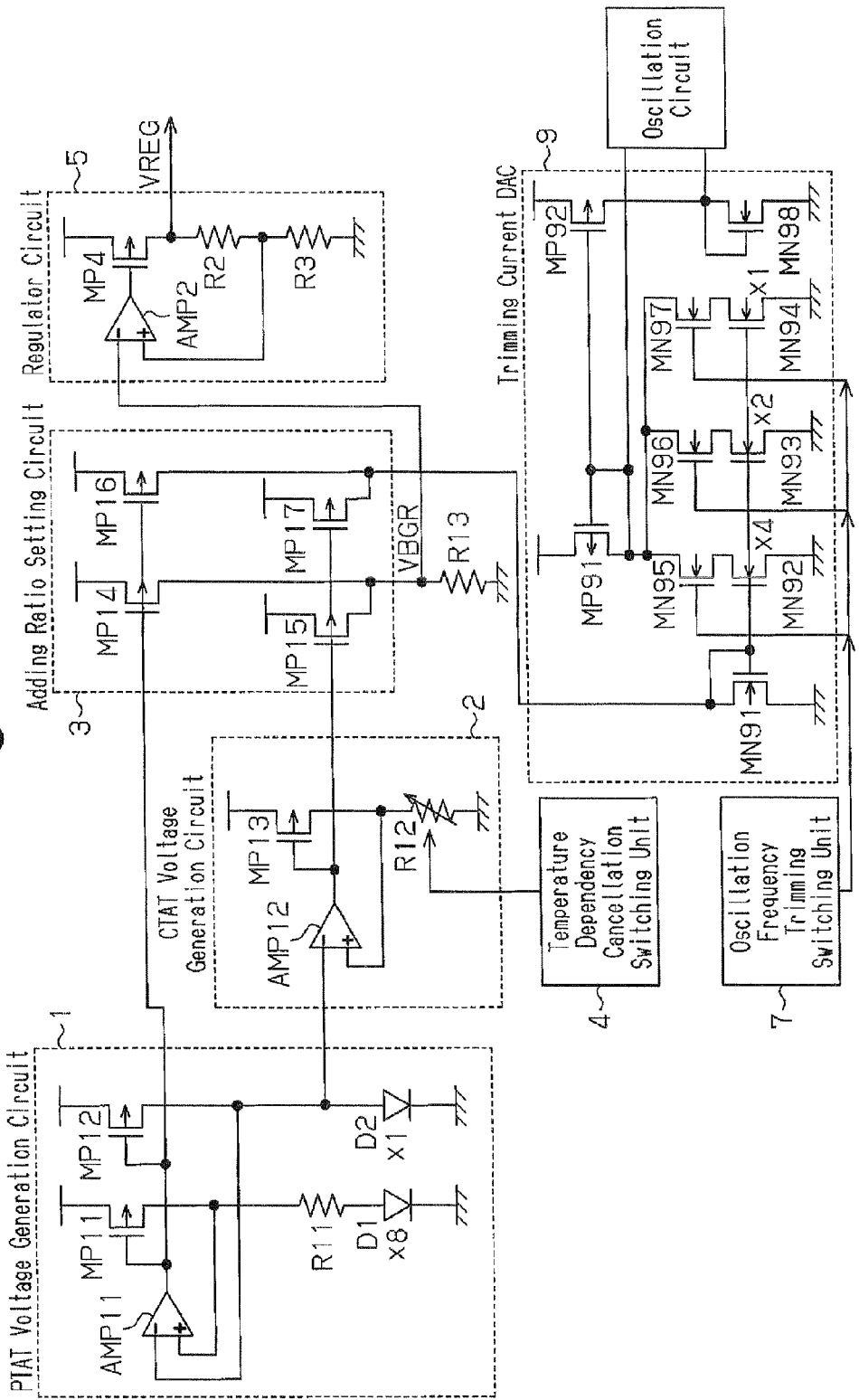
FIG. 15 is a circuit diagram of a trimming current DAC.
Figure 16:
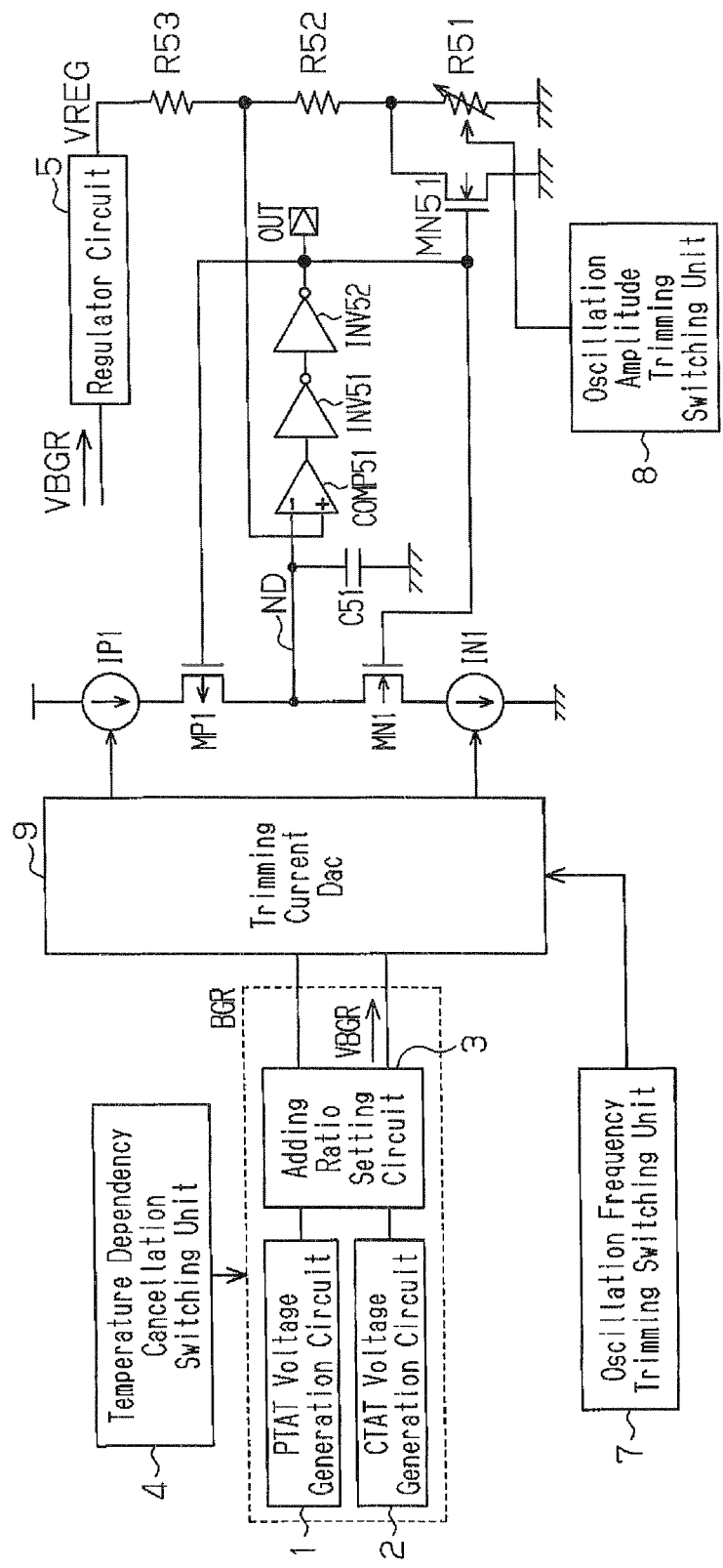
FIG. 16 is a block diagram of an oscillation circuit according to a third embodiment.

The adding ratio setting circuit 3 in FIG. 15 includes, in addition to the PMOS transistors MP14 and MP15 in FIG. 7, the PMOS transistors MP16 and MP17. A gate voltage of the PMOS transistor MP16 is controlled by an output from the operational amplifier AMP11. For this reason, a current flowing in the PMOS transistor MP16 is a PTAT current, and an absolute value of the current is determined by differences between a size ratio of the PMOS transistor MP16 and size ratios of the PMOS transistors MP11 and MP12. A gate voltage of the PMOS transistor MP17 is controlled by an output from the operational amplifier AMP12. For this reason, current flowing in the PMOS transistor MP17 is a CTAT current, and an absolute value of the current is determined by a difference between a size ratio of the PMOS transistor MP17 and a size ratio of the PMOS transistor MP13.

The band gap reference circuit BGR supplies a reference voltage VBGR to the regulator circuit 5. The adding ratio setting circuit 3 supplies a current obtained by adding a current flowing in the PMOS transistor MP16 and a current flowing in the PMOS transistor MP17 to the trimming current DAC as an output from the band gap reference circuit BGR. This current flows in the NMOS transistor MN91 of the trimming current DAC 9. NMOS transistors MN92, MN93, and MN94 configure a current mirror circuit that distributes the reference current flowing in the NMOS transistor MN91 to the PMOS transistor MP91. Numbers (x4, x2, and x1) added to the NMOS transistors MN92, MN93, and MN94 denote examples of mirror ratios of the current mirror circuit. NMOS transistors MN95, MN96, MN97 are coupled in series with the NMOS transistors MN92, MN93, and MN94, respectively. The PMOS transistor MP92 configures a current mirror circuit that distributes a current flowing in the PMOS transistor MP91 to an NMOS transistor MN98. The trimming current DAC 9 supplies gate voltages of the PMOS transistor MP91 and the NMOS transistor MN98 to the current sources IP1 and IN1 of the oscillation circuit unit, respectively.

In the illustrated example, the oscillation frequency trimming switching unit 7 switches the ON/OFF states of the NMOS transistors MN95, MN96, MN97 to switch ratios of the reference current flowing in the NMOS transistor MN91 and currents flowing in a PMOS transistor MP91 and the NMOS transistor MN98. In this manner, the values of the constant currents of the current sources IP1 and IN1 are switched.

The second embodiment has the same advantages as the first embodiment. In the second embodiment, since the band gap reference circuit is commonly used, the number of circuit elements can be reduced, and an occupied circuit area for an oscillation circuit can be reduced.

A third embodiment of an oscillation circuit will now be described focusing on differences from the first and second embodiments. Like or same reference numerals are given to those components that are the same as the corresponding components of the first and second embodiments. Such components will not be described.

The oscillation circuit according to the third embodiment is different in configuration from the oscillation circuit units according to the first and second embodiments. The oscillation circuit unit according to the third embodiment includes a comparator COMP51, inverters INV51 and INV52, a capacitor C51, the current sources IP1 and IN1, the PMOS transistor MP1, NMOS transistors MN1 and MN51, resistors R51, R52, and R53, and an oscillation amplitude trimming switching unit 8.

The resistors R51, R52, and R53 are coupled in series with each other to divide the output voltage VREG from the regulator circuit 5. An inverted input terminal of the comparator COMP51 is coupled to one terminal (node ND) of the capacitor C51. An input terminal of the inverter INV51 is coupled to an output terminal of the comparator COMP51. An input terminal of the inverter INV52 is coupled to the output terminal of the inverter INV51. The inverter INV52 inverts a rectangular waveform oscillation signal output from the inverter INV51 to output the inverted rectangular waveform oscillation signal from an output terminal OUT. The inverter INV52 inverts an output from the inverter INV51 and supplies the inverted output to the gates of the PMOS transistor MP1 and the NMOS transistors MN1 and MN51. According to an output from the inverter INV52, when the PMOS transistor MP1 and the NMOS transistor MN1 are alternately turned on, said one terminal of the capacitor C51 is coupled to the current source IP1 or IN1 to charge and discharge the capacitor C51. The NMOS transistor MN51 is coupled in parallel to the resistor R51. The NMOS transistor MN51 is turned on depending on an output from the comparator COMP51 to configure a switch that short-circuits the resistor R51.

Figure 17:
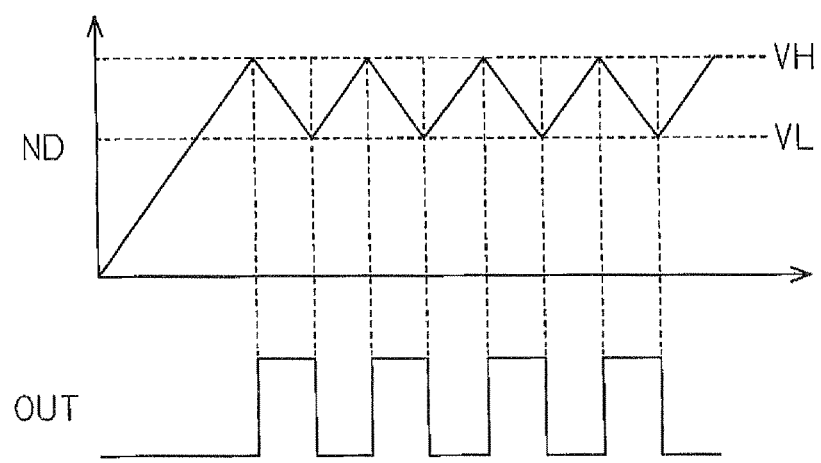
FIG. 17 is a waveform chart illustrating waveforms at nodes in the oscillation circuit unit according to the third embodiment.

Waveforms at the node ND and the output terminal OUT in the oscillation circuit unit in the third embodiment will be described below with reference to FIG. 17. In the third embodiment, the oscillation amplitude $\Delta V$ of the node ND is expressed by the following equation:

$$\Delta V = VH - VL = ((R51+R52)/(R51+R52+R53) - R52/(R52+R53)) \times VREG \quad (5)$$

Here, R51, R52, and R53 are resistances of the resistors R51, R52, and R53, respectively. In the third embodiment, the oscillation amplitude trimming switching unit 8 switches the resistance of the resistor R51 to adjust the oscillation amplitude ΔV. In this manner, a fixed frequency is also generated in the third embodiment in the same manner as in the first and second embodiments.

As described above in detail, in the first to third embodiments, a charging and discharging current, which determines an oscillation frequency when a reference voltage output from the band gap reference circuit is low, decreases to lower the oscillation frequency. When the reference voltage output from the band gap reference circuit is low, an oscillation amplitude decreases to raise the oscillation frequency. In the oscillation circuit, a temperature dependency of a charging and discharging current is the same as a temperature dependency of an output voltage of the regulator circuit. When the oscillation amplitude trimming switching unit 8 adjusts the oscillation amplitude, a quadratic temperature dependency does not occur in the oscillation frequency, and a high-precision (for example, within ±1%) oscillation circuit can be realized.

It should be apparent to those skilled in the art that the present invention may be embodied in many other specific forms without departing from the spirit or scope of the invention. Particularly, it should be understood that the present invention may be embodied in the following forms.

For example, the configuration of the band gap reference circuit is not limited to the configurations of the embodiments. The cancellation of the temperature dependency of the band gap reference circuit is not limited to a configuration that is described in FIG. 7 and switches resistance of the resistor R12. For example, in the adding ratio setting circuit 3 in FIG. 7, a plurality of transistors can be arranged in parallel with the PMOS transistors MP14 and MP15. The parallel transistors including the PMOS transistor MP14 may be referred to as a plurality of fourth PMOS transistors. Parallel transistors including the PMOS transistor MP15 may be referred to as a plurality of fifth PMOS transistors. A switch circuit that variably switches the numbers (the number of activated transistors) of transistors selected from the plurality of fourth PMOS transistors and the plurality of fifth PMOS transistors may switch adding ratios of the PTAT current and the CTAT current. The switch circuit can function as a first switching unit like the temperature dependency cancellation switching unit 4.

In the first and second embodiment, the oscillation amplitude trimming switching unit 8 may switch the capacitance of the capacitor C2 taking into consideration the change in the oscillation frequency based on equation (4).

In the resistor switching unit and the capacitor switching unit described in FIGS. 12 and 13, weightings of the resistance and the capacitance are used. However, elements having equal values may be arranged as a matter of course. Coupling forms such as series coupling and parallel coupling may be changed.

In addition, the embodiments may be combined with one another in any manner.

The band gap reference circuits BGR1, BGR2, and BGR are examples of the reference voltage generation circuit, the temperature dependency cancellation switching unit 4 is an example of the first switching unit, the current sources IP1 and IN1 are examples of the current source, the regulator circuit 5 is an example of the regulator circuit, the capacitors C1 and C51 are examples of the first capacitor, the capacitor C2 is an example of the second capacitor, the PMOS transistor MP2 and the NMOS transistor MN2 are examples of the inverter, the oscillation frequency trimming switching unit 7 is an example of the second switching unit, the oscillation amplitude trimming switching unit 8 is an example of the third switching unit, the resistors R51, R52, and R53 are examples of the first, second, and third voltage dividing resistors, the comparator COMP51 is an example of the comparator, the NMOS transistor MN51 is an example of the switch, the resistor R1 is an example of the reference resistor, the operational amplifier AMP1 and the PMOS transistor MP3 are examples of the feedback amplification circuits, the NMOS transistors MN91, MN92, MN93, and MN94 are examples of the current mirror circuits, the PMOS transistors MP11, MP12, MP13, MP14 and MP15 are examples of the first, second, third, fourth, and fifth PMOS transistors, the resistors R11 and R12 are examples of first and second resistors, the diodes D1 and D2 are examples of the first and second diodes, and the operational amplifiers AMP11 and AMP12 are examples of the first and second operational amplifiers.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An oscillation circuit comprising:
   a reference voltage generation circuit that adds a proportional-to-absolute-temperature (PTAT) output, which increases in proportion to an absolute temperature, to a complementary-to-absolute-temperature (CTAT) output, which decreases in proportion to an absolute temperature, to generate and output a reference voltage;
   a first switching unit coupled to the reference voltage generation circuit, wherein the first switching unit switches an adding ratio of the PTAT output and the CTAT output to minimize a variation in an output from the reference voltage generation circuit that depends on temperature;
   a current source that generates current which has a current value based on the output from the reference voltage generation circuit;
   a regulator circuit that generates constant voltage based on the output from the reference voltage generation circuit;
   a first capacitor and a second capacitor, each including one terminal coupled to the current source and charged and discharged by the current of the current source;
   an inverter coupled to another terminal of the second capacitor, wherein the inverter drives the second capacitor using the constant voltage supplied from the regulator circuit as a power supply;
   a second switching unit that switches a value of the current of the current source to adjust an oscillation frequency; and
   a third switching unit coupled to the first capacitor, wherein the third switch unit switches capacitance of the first capacitor to adjust oscillation amplitudes at the one terminal of each of the first and second capacitors;
   wherein trimming of the first switching unit, the second switching unit, and the third switching unit is performed to generate an oscillation signal having a desired frequency.

2. The oscillation circuit according to claim 1, further comprising:

a reference resistor having a switchable resistance; and
a feedback amplification circuit that performs feedback control to match a voltage applied to the reference resistor with a voltage of the output of the reference voltage generation circuit;
wherein the second switching unit is coupled to the reference resistor and switches the resistance of the reference resistor to switch a value of the current of the current source.

3. The oscillation circuit according to claim 2, wherein the reference voltage generation circuit includes:
   a PTAT voltage generation circuit generating the PTAT output; and
   a CTAT voltage generation circuit generating the CTAT output, wherein the CTAT voltage generation circuit includes:
      a third PMOS transistor and a second resistor coupled in series between the power supply and ground, wherein the second resistor has a switchable resistance, and
      a second operational amplifier coupled to coupled to a second diode in the PTAT voltage generation circuit to receive a forward voltage of the second diode in the PTAT voltage generation circuit, wherein the second operational amplifier performs feedback control to match a voltage at a second resistor node between the third PMOS transistor and the second resistor with the forward voltage of a second diode in the PTAT voltage generation circuit;
   wherein the first switching unit is coupled to the second resistor of the CTAT voltage generation circuit and switches the resistance of the second resistor to switch an adding ratio of the PTAT output to the CTAT output.

4. The oscillation circuit according to claim 1, further comprising a current mirror circuit that is coupled to the reference voltage generation circuit and distributes a reference current based on an output from the reference voltage generation circuit,
   wherein the second switching unit is coupled to the current mirror circuit and switches a mirror ratio of the current mirror circuit to switch a value of the constant current of the current source.

5. The oscillation circuit according to claim 1, wherein the reference voltage generation circuit includes:
   a PTAT voltage generation circuit including:
      a first PMOS transistor, a first resistor, and a first diode coupled in series between a power supply and ground,
      a second PMOS transistor and a second diode that are coupled in series between the power supply and ground, and
      a first operational amplifier that performs feedback control to match a voltage at a first resistor node between the first PMOS transistor and the first resistor with a forward voltage of the second diode;
   a CTAT voltage generation circuit coupled to the PTAT voltage generation circuit and including:
      a third PMOS transistor and a second resistor coupled in series between the power supply and ground, wherein the second resistor has a switchable resistance, and
      a second operational amplifier that performs feedback control to match a voltage at a second resistor node between the third PMOS transistor and the second resistor with the forward voltage of the second diode in the PTAT voltage generation circuit;
   an adding ratio setting circuit coupled to the PTAT voltage generation circuit and the CTAT voltage generation circuit and including:
      a fourth PMOS transistor including a gate coupled to the first operational amplifier of the PTAT voltage generation circuit and controlled by an output from the first operational amplifier, and
      a fifth PMOS transistor including a gate coupled to the second operational amplifier of the CTAT voltage generation circuit and controlled by an output from the second operational amplifier;
   wherein the first switching unit is coupled to the second resistor of the CTAT voltage generation circuit and switches the resistance of the second resistor to switch an adding ratio of the PTAT output and the CTAT output.

6. The oscillation circuit according to claim 1, wherein the reference voltage generation circuit includes:
   a PTAT voltage generation circuit including:
      a first PMOS transistor, a first resistor, and a first diode that are coupled in series between a power supply and ground,
      a second PMOS transistor and a second diode that are coupled in series between the power supply and ground, and
      a first operational amplifier that performs feedback control to match a voltage at a first resistor node between the first PMOS transistor and the first resistor with a forward voltage of the second diode;
   a CTAT voltage generation circuit coupled to the PTAT voltage generation circuit and including:
      a third PMOS transistor and a second resistor coupled in series between the power supply and ground, wherein the second resistor has a switchable resistance, and
      a second operational amplifier that performs feedback control to match a voltage at a second resistor node between the third PMOS transistor and the second resistor with the forward voltage of the second diode;
   an adding ratio setting circuit coupled to the PTAT voltage generation circuit and the CTAT voltage generation circuit, wherein the adding ratio setting circuit includes:
      a plurality of fourth PMOS transistors including a gate coupled to the first operational amplifier of the PTAT voltage generation circuit and controlled by an output from the first operational amplifier, and
      a plurality of fifth PMOS transistors including a gate coupled to the second operational amplifier of the CTAT voltage generation circuit and controlled by an output from the second operational amplifier;
   wherein the first switching unit switches the number of selected fourth PMOS transistors and the number of selected fifth PMOS transistors in the CTAT voltage generation circuit to switch an adding ratio of the PTAT output and the CTAT output.

7. The oscillation circuit according to claim 1, wherein after the trimming of the first switching unit and the third switching unit is performed, the trimming of the second switching unit is performed.

* * * * *